United States Patent [19]

Thompson

[11] 4,379,324

[45] Apr. 5, 1983

[54] BULB MOUNTING OF SOLAR CELL

[76] Inventor: Marion E. Thompson, 2807 N. Prospect St., Colorado Springs, Colo. 90907

[21] Appl. No.: 303,501

[22] Filed: Sep. 18, 1981

[51] Int. Cl.$^3$ .................. F21V 33/00; H01L 31/04
[52] U.S. Cl. .................................. 362/253; 40/473; 136/246; 136/259; 136/291
[58] Field of Search .................. 136/246, 259, 291; 362/253, 457; 40/473

[56] References Cited

U.S. PATENT DOCUMENTS

| | | | |
|---|---|---|---|
| 2,796,688 | 6/1957 | Van Praag | 40/131 |
| 2,928,198 | 3/1960 | Madanick | 40/558 |
| 3,325,930 | 6/1967 | Braeutigam | 40/33 |
| 4,116,718 | 9/1978 | Yerkes | 136/246 |
| 4,136,474 | 1/1979 | Belokin, Jr. | 40/559 |
| 4,144,095 | 3/1979 | Mlavsky | 136/246 |
| 4,281,208 | 7/1981 | Kuwano et al. | 136/249 MS |

FOREIGN PATENT DOCUMENTS 841259 6/1952 Fed. Rep. of Germany .

OTHER PUBLICATIONS

M. W. Edenburn et al., "Status of the DOE Photovoltaic Concentrator Technology Development Project", Conf. Record, 13th IEEE Photovoltaic Specialists Conf. (1978), pp. 1028-1039.

Primary Examiner—Aaron Weisstuch
Attorney, Agent, or Firm—Cushman, Darby & Cushman

[57] ABSTRACT

An energy converting assembly is provided for parasiting of light from a fluorescent light bulb utilizing a solar cell. The solar cell is mounted on a base member elongated in the dimension of elongation of the fluorescent bulb, and electrical interconnections to the cell are provided. A flexible sheet of opaque material having a flat white interior reflective surface surrounds the fluorescent bulb and reflects light emitted from the bulb back toward the bulb and the solar cell. The reflective sheet is tightly held in contact with the bottom of the bulb by adhesive, a tie strap, an external clip, or the like.

28 Claims, 4 Drawing Figures

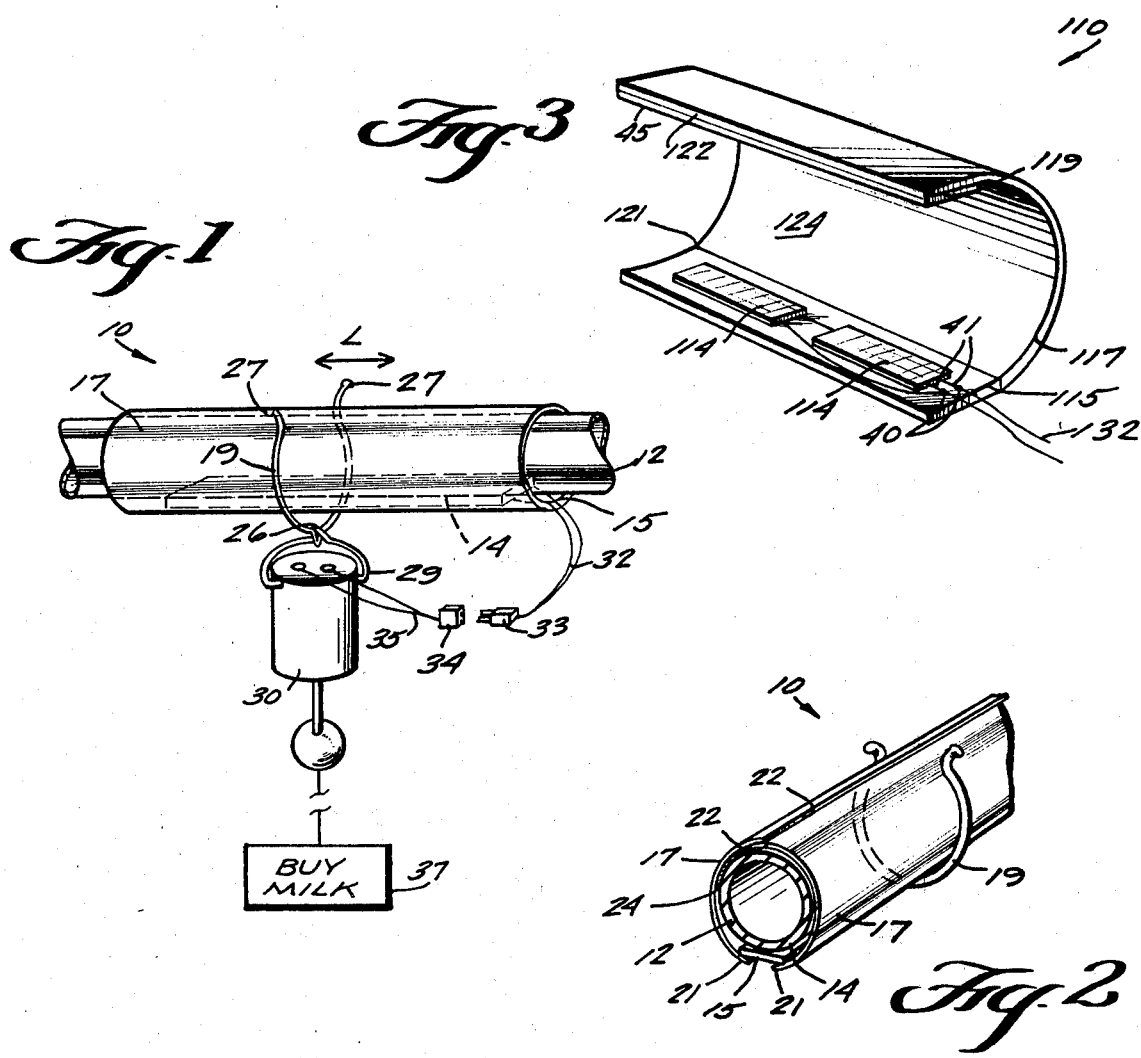
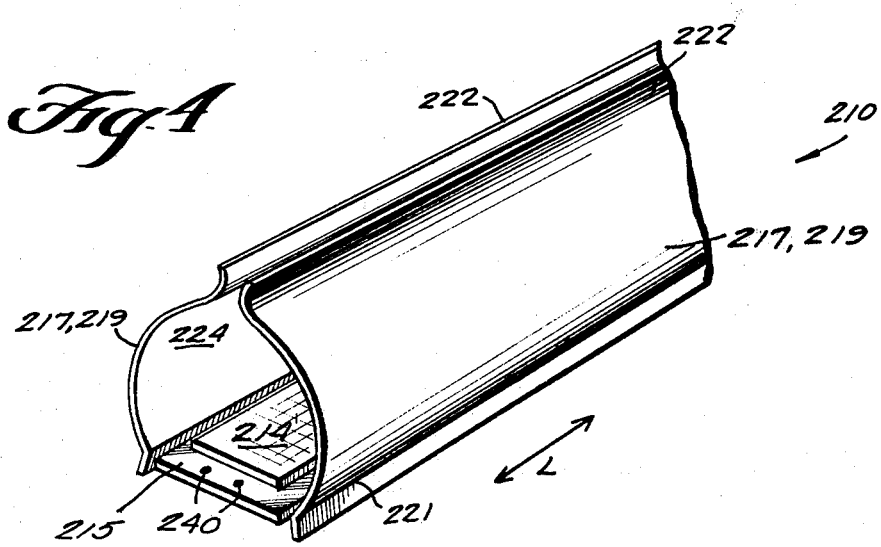

BULB MOUNTING OF SOLAR CELL

BACKGROUND AND SUMMARY OF THE INVENTION

In the merchandising of products and in the provision of conversation pieces for homes and offices, it is desirable to provide motive power for the merchandising or conversation piece devices by parasiting light from pre-existing light bulbs. Utilizing apparatus such as illustrated and described in copending application Ser. No. 142,995 filed Apr. 23, 1980, it is possible to successfully employ such a parasiting principle even for conventional fluorescent light bulbs. In view of the expensiveness of solar cells, however, it is desirable to maximize the efficiency of such units. When this done, a wider variety of point-of-purchase or other attention-capturing devices may be effectively powered from conventional fluorescent bulbs, and/or existing devices can be powered less expensively.

According to the present invention an energy converting assembly for attachment to an elongated light source, such as a conventional fluorescent tube, is provided that effects up to a 50% power output improvement in current, and up to 25% improvement in voltage, over corresponding devices such as illustrated in copending application Ser. No. 142,995. This unexpectedly significant improvement in power output is generally accomplished by a number of structures and techniques: the solar cell (or cells) is elongated in the dimension of elongation of the fluorescent tube and is held tightly against the bottom surface of the fluorescent tube; the cell and tube are wrapped with a reflector which is capable of reflecting substantially all the light impacting it upon back toward the tube and the solar cell; the reflector extends beyond the solar cell at either end thereof; and the cell surface is cleaned and coated with a temperature-resistant light-reflection minimizing spray.

According to the present invention an assembly is provided for attachment to an elongated light source—such as a conventional fluorescent light bulb—for converting light energy from the bulb into electrical energy, and subsequently for powering a d.c. motor or the like. The assembly includes a solar cell, and an elongated base member to which the solar cell is mounted. The base member may be of a thin relatively rigid material, such as stiff cardboard or plastic, and the solar cell may be mounted thereto by double-faced tape or the like. Electrical interconnections are operatively attached to the solar cell for carrying away electrical energy produced by the cell to a remote location (such as a d.c. motor). Reflective means are provided substantially surrounding the fluorescent tube along the length of the base member for reflecting substantially all the light impinging thereon back toward the light source and the solar cell.

The light reflective means preferably comprises one or more sheets of flexible opaque material having an inner surface thereof of reflective color, preferably flat white. For instance, the opaque flexible material may be cardboard, or paper mounted on cardboard, or paper with Mylar foil on its exterior surface. Alternatively, the opaque flexible material may comprise plastic formed as spring clips form receiving the fluorescent tube therebetween. Holding means are provided for mounting the reflective means around the fluorescent tube, and for holding the solar cell tightly against the bottom surface of the fluorescent tube. Such holding means may be the inherent spring qualities of the flexible material (when plastic), adhesive associated with the reflective sheet (as when cardboard), or an exterior spring clip.

A d.c. motor may conveniently be mounted in association with the energy converting assembly by hanging it from a spring clip which holds the reflective means and solar cell in place. Hanging downwardly from the d.c. motor may be a sign having indicia thereon, and any of the interconnections between motor and sign illustrated in copending application Ser. No. 142,995 filed Apr. 23, 1980 (the disclosure of which is hereby incorporated by reference herein) may be provided. The assembly may readily be utilized as a point-of-purchase device, or may be utilized to effect air movement from the volume surrounding the fluorescent tube, or may power a wide variety of other devices for ornamental, conversational, or functional reasons.

It is the primary object of the present invention to provide an efficient energy converting assembly for utilization with an elongated light source like a fluorescent light bult. This and other objects of the invention will become clear from an inspection of the detailed description of the invention, and from the appended claims.

DETAILED DESCRIPTION OF THE DRAWINGS

FIG. 1 is a perspective view of an exemplary assembly according to the present invention shown mounted with a fluorescent light tube;

FIG. 2 is another perspective view of the assembly of FIG. 1 showing the tube in cross-section, and with portions thereof removed for clarity of illustration;

FIG. 3 is a perspective view of another embodiment of an exemplary assembly according to the invention; and FIG. 4 is a perspective view of yet another exemplary embodiment of an assembly according to the invention.

DETAILED DESCRIPTION OF THE INVENTION

An exemplary energy converting assembly according to the present invention is shown generally at 10 in FIGS. 1 and 2. The assembly 10 is especially adapted for use with an elongated light source, such as a linear light source like a conventional fluorescent tube 12. The major components of the assembly 10 include a solar cell 14 of conventional type, an elongated base member 15, light reflective means such as cardboard sheets 17, and means for holding the light reflective means 17 in place substantially surrounding tube 12 and holding the solar cell 14 tightly against the bottom surface of tube 12, such as external spring clip 19. While mounting of the cell 14 against the bottom of the tube 12 is preferred since its location is the coolest and allows maximum power of the cell over extended usage, where necessary the cell 14 can be mounted against one or more other surfaces of the tube 12.

In the embodiment illustrated in FIGS. 1 and 2, the light reflective means comprises the two cardboard sheets 17 which are integral with the base member 15 along one end 21 thereof (as being attached to the base 15 by adhesive or formed from the square sheet of cardboard), and have an opposite parallel free edge 22 thereof. The free edges 22 of the cardboard sheets 17 preferably overlap as illustrated in FIGS. 1 and 2. The inner surfaces (see surface 24 in FIG. 2) of the sheets 17 are of reflective color, most desirably a flat white. The inner surfaces 24 should not be mirror-like or shiny. The thickness or composition of the sheet 17 should be sufficient so that the sheets are substantially opaque, reflecting substantially all of the light incident upon the inner surfaces 24 thereof. If desired, the sheet 17 may be made of paper laminated to relatively heavy cardboard, or laminated to Mylar foil, or paper or cardboard contained within a surrounding polygon of heavier material. The members 17 need not necessarily be curved, but can provide a polygon configuration (e.g. octagon) when surrounding tube 12.

The base member 15 preferably is a thin relatively rigid member, such as cardboard, metal, printed circuit board, or plastic, and is elongated in the dimension of elongation L (see FIG. 1) of the tube 12. The length of the reflective member 17 in dimension L preferably is sufficient so that both ends of the solar cell 14 are overlapped a significant amount (e.g. up to about 2 inches). The cell 14 is also elongated in the dimension L and may be mounted to the base member 15 by any convenient means, such as double-faced tape, and desirably is mounted within a recess (not shown), e.g. about 3/32 inch deep, in the base member 15 so that the top of cell 14 does not extend too far above the top of base 15.

Desirably, the face of the cell is cleaned with acetone or MEK. Then the cell face is coated with a temperature resistant light reflection coating. For instance, the surface of cell 14 in engagement with tube may be sprayed with Krylon ® paint. The surface of cell 14 can be potted or overlaid with epoxy RTV for more protection.

The spring clip 19 may be metal or plastic, and has sufficient resiliency and spring force to hold the reflective member 17 surrounding the tube 12, and to hold the cell 14 tightly against the surface of the tube 12. A desirable configuration of the clip 19 is seen most clearly in FIG. 1, wherein a V-forming mounting means 26 is provided on the bottom thereof, opposite free ends 27 thereof, the V-shaped mounting member 26 adapted to receive a bail 29, or the like, attached to a d.c. motor 30. The motor 30 may be of a type such as shown in copending application Ser. No. 142,995 filed Apr. 23, 1980, or any other suitable type, and is electrically connected to the cell 14. For instance, a first set of wires 32 may extend from electrical connections on base member 15 operatively connected to solar cell 14, with an electrical connector plug 33 provided on the end thereof. The plug 33 cooperates with another connector plug 34 (e.g. with a male and female interconnection) associated with wires 35 extending to d.c. motor 30.

Preferably the motor 30 is connected to a sign 37 or like display device, which may have indicia thereon. Interconnection therebetween may be provided by a slip swivel connector, a piece of metal foil, or like connecting means such as illustrated in said copending application Ser. No. 142,995.

Another exemplary embodiment of an energy converting assembly according to the present invention is illustrated generally by reference numeral 110 in FIG. 3. In FIG. 3 components corresponding to components in the FIGS. 1 and 2 embodiment are indicated by a like reference numeral only preceded by the number "1". In this case, the base member 115 includes a plurality of solar cells 114 mounted thereon, with electrical wires 132 extending from eyelets 40 formed on base member 115, which in turn are electrically interconnected by fine wires 41 or the like to the solar cells 114. The light reflective means in this embodiment comprises a single sheet of cardboard 117 (formed from the same sheet as base 115) having a flat white inner surface 124. The holding means in this embodiment comprises adhesive 119 formed on free edge 122 of sheet 117, opposite edge 121 which is integral with base member 117. A piece of release paper 45 may be provided covering the adhesive 119, and when the release paper 45 is removed and the sheet 117 wrapped around a tube 12, the adhesive 119 engages the bottom of the base member 115 holding the sheet 117 in place surrounding the tube 12. Alternatively a conventional wire tie strap could be utilized.

In the embodiment illustrated in FIG. 4, components corresponding in function to those in the FIGS. 1 and 2 embodiment are indicated by like reference numerals only preceded by a "2". In this embodiment, the assembly is shown generally by reference numeral 210, and the reflective means and holding means comprise a pair of plastic clips 217, 219. Each clip is integral at an end 221 thereof with the base member 215, and has a free end 222 thereof. Any suitable plastic having spring qualities can be used for constructing the components 217, 219, and preferably radiation retardants are included therein to eliminate degradation with time due to the frequency of fluorescent light emissions. The interior surfaces 224 of the members 217, 219 are painted flat white, or pigment is utilized during the manufacture of the members 217, 219 so that the surfaces 224 are flat white. The free ends 222 of the clip portions 217, 219 are slightly spaced from each other and curled back to provide cam surfaces so that if an upward force is applied to the assembly 210 with the edges 222 in engagement with the bottom of a fluorescent tube 12, the edges 222 will move apart until they pass the center of the tube 12, and then come back toward each other, holding the cell 214 tightly in place against the bottom of the tube 12, with clips 217 substantially surrounding the tube 12.

OPERATION

In a typical manner of utilization of exemplary apparatus according to the present invention—with particular reference to the embodiment of FIGS. 1 and 2—the base member 15 is moved toward the bottom of the tube 12 so that solar cell 14 thereon engages the bottom of tube 12. Then sheets 17 are wrapped around the tube 12 so that the free edges 22 thereof overlap. A free end 27 of clip 19 is passed between bail 29 and motor 30, and the bail 29 is moved into engagement with mounting portion 26 of clip 19. Then the free ends 27 of clip 19 are brought into engagement with side portions of sheet 17 and an upward force is applied, causing the free ends 27 to move apart, and when they pass the center portion of the tube 12 to move back toward each other. In that position (see FIG. 1) clip 19 holds the sheets 17 in place surrounding the tube 12, and holds the solar cell 14 against the bottom of tube 12.

Connector 33 is brought into operative engagement with connector 34, and then whenever light 12 is turned on light emitted therefrom along the length of the sheet 17 is reflected back toward the tube 12 and ultimately to the cell 14. Light energy is converted into electricity, which powers the motor 30, ultimately resulting in rotation of the sign 37 or the like. The assembly 10 can be installed anywhere there is a fluorescent tube 12, and may be installed quickly and easily. The assembly 10 is capable of providing up to 50% output improvement in current and up to 25% output improvement in voltage compared to prior structures, making it possible to adequately power most conventional point-of-purchase displays, conversation pieces, and the like with only a small and unobtrusive structure (e.g. having a length in dimension L of only about 5 to 6 inches). Additionally, the components are extremely inexpensive and easy to fabricate.

It will thus be seen that according to the present invention an efficient energy converting assembly, particularly for powering point-of-purchase and novelty items, has been provided. While the invention has been herein shown and described in what is presently conceived to be the most practical and preferred embodiment thereof, it will be apparent to those of ordinary skill in the art that many modifications may be made thereof within the scope of the invention, which scope is to be accorded the broadest interpretation of the appended claims so as to encompass all equivalent structures and devices.

What is claimed is:

1. An energy converting assembly for attachment to an elongated light source, and comprising:
    a solar cell;
    an elongated base member to which said solar cell is mounted;
    electrical interconnections operatively attached to said solar cell;
    light reflective wrap means operatively connected to said base member for mounting said base member on an elongated light source with the dimension of elongation of the base member coextensive with the dimension of elongation of the elongated light source, said light reflective wrap means dimensioned so as to substantially surround the elongated light source along substantially the length of said base member in the dimension of elongation thereof; and
    means for holding said wrap means in place substantially surrounding the light source.

2. An assembly as recited in claim 1 wherein said light reflective wrap means and said means for holding said wrap means in place comprise means for holding said solar cell tightly against a surface of the elongated light source.

3. An assembly as recited in claim 2 wherein said light reflective wrap means comprises at least one sheet of opaque flexible material having an inner surface thereof of reflective color.

4. An assembly as recited in claim 3 wherein said inner surface of said sheet of opaque flexible material is flat white.

5. An assembly as recited in claim 4 wherein said opaque flexible material is cardboard.

6. An assembly as recited in claim 4 wherein said opaque flexible material is plastic.

7. An assembly as recited in claim 5 wherein said means for holding said wrap means in place comprises an integral attachment of said base to said flexible sheet along one edge of each in the dimension of elongation of said base member, and a free edge of said flexible sheet substantially parallel to the edge thereof connected to said base member and having adhesive means associated therewith for attaching said free edge to said base member.

8. An assembly as recited in claim 5 wherein said means for holding said wrap means in place comprises a flexible clip engaging exterior surface portions of said flexible material.

9. An assembly as recited in claim 8 wherein said at least one sheet of flexible material comprises two sheets of flexible material, each having one edge thereof integral with said base member and another parallel free edge thereof, the free edges of said sheets overlapping when surrounding the elongated light source.

10. An assembly as recited in claim 8 further comprising a d.c. electric motor, and wherein said clip includes means for mounting said d.c. electric motor thereto; and further comprising electrical interconnections extending between said solar cell and said d.c. electric motor.

11. An assembly as recited in claim 6 wherein said plastic comprises a pair of clip portions, one extending integrally from each portion of said base member and integral therewith along one edge thereof, and having a free edge adjacent the free edge of the other clip portion; said clip portions having inherent spring bias and comprising said means for holding said wrap means in place.

12. An assembly as recited in claims 3 or 4 wherein said reflective wrap means extends beyond said solar cell at each end thereof in the dimension of elongation of said base member.

13. An assembly as recited in claim 1 wherein said solar cell comprises a first solar cell, and further comprising at least one other solar cell mounted on said base member adjacent said first solar cell.

14. An assembly as recited in claim 13 wherein said reflective wrap means extends beyond said solar cells at each end thereof in the dimension of elongation of said base member.

15. An assembly as recited in claims 1 or 2 wherein said base member is rigid and thin, and said solar cell is mounted thereto by double-faced tape.

16. An assembly as recited in claims 1, 4, or 13 further comprising temperature resistant coating means on said solar cell for minimizing light reflection from the cell face.

17. An assembly as recited in claim 1 wherein said light reflective wrap means comprises at least one sheet of opaque flexible material having an inner surface thereof of reflective color.

18. An assembly as recited in claim 17 wherein said opaque flexible material is cardboard.

19. An assembly as recited in claim 18 wherein said means for holding said wrap means in place comprises a flexible clip engaging exterior surface portions of said flexible material.

20. An assembly as recited in claim 19 wherein said at least one sheet of flexible material comprises two sheets of flexible material, each having one edge thereof integral with said base member and another parallel free edge thereof, the free edges of said sheets overlapping when surrounding the elongated light source.

21. An assembly as recited in claim 19 further comprising a d.c. electric motor, and wherein said clip comprises means for mounting said d.c. electric motor thereto; and further comprising electrical interconnections extending between said solar cell and said d.c. electric motor.

22. An assembly comprising:
    an elongated light source;
    a base member including a solar cell associated therewith, said base member elongated in the same dimension as said light source;

reflective means substantially surrounding said light source along the length of said base member for reflecting substantially all the light impinging thereon back toward said light source and said solar cell;

means for holding said solar cell tightly against a bottom surface of said light source with said reflecting means substantially surrounding said light source; and electrical connections operatively connected to said solar cell for carrying away electrical energy produced thereby.

23. An assembly as recited in claim 22 wherein said reflective means comprises at least one sheet of flexible opaque sheet material integral with said base member along one edge thereof in the dimension of elongation of said base member, and overlapping said solar cell at both ends thereof in the dimension of elongation of said base member.

24. An assembly as recited in claim 23 wherein said sheet has an inner surface that is flat white.

25. An assembly as recited in claims 23 or 24 wherein said sheet is composed, at least in part, of cardboard.

26. An assembly as recited in claim 25 wherein said holding means includes said at least one sheet.

27. An assembly as recited in claims 26 or 23 wherein said holding means comprises a flexible clip engaging exterior portions of said reflective means.

28. An assembly as recited in claim 27 further comprising a d.c. electric motor, and wherein said clip comprises means for mounting said d.c. electric motor thereto; and further comprising electrical interconnections extending between said solar cell and said d.c. electric motor.

* * * * *